(12) United States Patent
Ryan et al.

(10) Patent No.: US 6,414,558 B1
(45) Date of Patent: *Jul. 2, 2002

(54) METHOD AND APPARATUS FOR RANDOM SEQUENCE GENERATOR

(75) Inventors: John G. Ryan, Rochestown; John M. Horan, Little Island, both of (IL)

(73) Assignee: Parthus Ireland Limited, Dublin (IR)

( * ) Notice: Subject to any disclaimer, the term of this patent is extended or adjusted under 35 U.S.C. 154(b) by 0 days.

This patent is subject to a terminal disclaimer.

(21) Appl. No.: 09/664,042

(22) Filed: Sep. 18, 2000

Related U.S. Application Data

(63) Continuation of application No. 09/356,108, filed on Jul. 16, 1999, now Pat. No. 6,188,294.
(60) Provisional application No. 60/133,787, filed on May 12, 1999.

(51) Int. Cl.[7] .......................... H03B 29/00; H03K 3/84; G06F 7/58
(52) U.S. Cl. .......................... 331/78; 327/164; 708/250
(58) Field of Search .......................... 331/78; 327/164; 708/250; 364/717

(56) References Cited

U.S. PATENT DOCUMENTS

| | | | | |
|---|---|---|---|---|
| 3,304,515 A | * | 2/1967 | Stieler | 331/78 |
| 3,706,941 A | * | 12/1972 | Cohn | 331/78 |
| 3,866,128 A | * | 2/1975 | Fletcher et al. | 328/59 |
| 4,169,249 A | * | 9/1979 | Hoffmann et al. | 331/78 |
| 4,176,399 A | * | 11/1979 | Hoffmann et al. | 364/717 |
| 4,545,024 A | * | 10/1985 | Maher et al. | 364/717 |
| 5,007,087 A | | 4/1991 | Bernstein et al. | |
| 5,627,775 A | | 5/1997 | Hong et al. | |
| 5,706,218 A | | 1/1998 | Hoffman | |
| 5,830,064 A | * | 11/1998 | Bradish et al. | 467/22 |
| 5,926,066 A | * | 7/1999 | Sauer | 330/9 |
| 6,061,702 A | | 5/2000 | Hoffman | |
| 6,188,294 B1 | * | 2/2001 | Ryan et al. | 331/78 |

OTHER PUBLICATIONS

"An Integrated Analog/Digital Random Noise Source," W.T. Holman, J.A. Connelly, A.B. Dowlatabadi, IEEE Transactions on Circuits and systems, vol. 44, No. 6, pp. 521–528, Jun. 1997.

"A High–Speed CMOS Comparator with 8–b Resolution," G.M. Yin, F.O. Eynde, W. Sansen, IEEE Journal of Solid–State Circuits, vol. 27, No. 2, pp. 208–211, Feb. 1992.

* cited by examiner

*Primary Examiner*—David Mis
(74) *Attorney, Agent, or Firm*—Blakely, Sokoloff, Taylor & Zafman

(57) ABSTRACT

An apparatus is described comprising a noise source coupled to an input of a gain stage. The apparatus also includes a noise shaping stage that forms a shaped noise signal by reducing 1/f noise introduced by the gain stage. The noise shaping stage has an input coupled to an output of the gain stage. The apparatus also has a decision circuit that decides whether the shaped noise signal, or a signal derived from the shaped noise signal corresponds to a 1 or a 0. A method is described that amplifies a first noise signal to produce a second noise signal. A shaped noise signal is formed by reducing 1/f noise introduced to the second noise signal by the amplifying. A random sequence is generated by comparing, against a reference, the shaped noise signal or a signal derived from the shaped noise signal.

19 Claims, 8 Drawing Sheets

METHOD AND APPARATUS FOR RANDOM SEQUENCE GENERATOR

This application is a continuation of, and claims the benefit of the filing date of, U.S. application No. 09/356,108, filed on Jul. 16, 1999, U.S. Pat. No. 6,188,294, which further claims the benefit of the filing date of U.S. provisional application No. 60/133,787, filed on May 12, 1999.

FIELD OF INVENTION

The field of invention relates to encryption technology, generally. More specifically, the field of invention relates to random sequence generator technology.

BACKGROUND OF THE INVENTION

Numerous applications such as on-line banking, on-line commerce, etc. involve sending sensitive information over a network. Some form of cryptography is typically employed in order to enhance the security of the sensitive information as it traverses the network. One type of encryption, referred to as keyed encryption, passes a key to the receiver of sensitive information. The key helps reverse the cryptography process such that an encoded or encrypted message is correctly decoded.

In many keyed encryption applications, the sensitive message is scrambled with random data. For example, the Vernam cypher method uses a random numeric key (i.e., a stream or sequence of random numbers) that is added to a stream of sensitive data to generate encrypted data. If the numbers of the key are truly random it is theoretically impossible to decode the encrypted data without the key. Thus, generally, as random number generators become less pseudo-random and more truly random, the probability that a "hacker" will be able to break the code (i.e., produce the random sequence) declines.

As such, a figure of merit of keyed encryption technology focuses on the randomness of the key sequence (also referred to as a "sequence")—with perfect randomness being the ultimate desired goal of the signal used to generate the sequence. A perfectly random signal is typically referred to as theoretically perfect "white noise". FIG. 1a, shows the magnitude of theoretically perfect white noise 100 in the frequency spectrum. Theoretically perfect white noise 100 is primarily characterized by two features: 1) infinite bandwidth 101; and 2) identical noise power amplitude 102 across all frequencies.

Although theoretically perfect white noise is difficult or perhaps impossible to achieve, signals that begin to approach the characteristics shown in FIG. 1a may be referred to as white noise. Thus white noise refers to signals that, although less then theoretically perfect, still resemble such a signal. Indicia include an approximately even amplitude across a wide bandwidth. The inverse Fourier transform of white noise is a random signal 201 such as that seen in FIG. 2. By definition, a perfectly random stream will flip up 50% of the time and flip down 50% of the time.

Random number generators are typically designed to sample a white noise signal 201 at a plurality of successive sample times 202a,b,c,d,e. Each successive sample time corresponds to a new value 203a,b,c,d,e in the random sequence 204. Generally, flips up 205a,b,c are "1s" 203a,b,c while flips down 206a,b are "0s" 203c,e. That is, the white noise is typically fed to a zero cross detector, threshold detector or other decision device.

As the channel bandwidth falls short of infinity the noise spikes seen in the random signal 201, widen. This results in less noise spike flips between sampling times as compared to perfect white noise. If fewer noise spike flips occur between sampling times, the sampled value may be viewed as being more dependent on the previous sample value. Better said, as the number of flips occurring between sampling times approach infinity, the probability that 50% are up and 50% are down approaches 1.00. Thus wider noise spikes correspond to less than perfect randomness.

Furthermore, as shown in FIG. 1b, any periodic activity associated with the channel that processes the white noise may introduce strong signal power 106 at the frequency 107 (or multiple thereof) of the periodic activity. These features are generally referred to as harmonics or tones. The presence of harmonics diminish the randomness of the sequence. That is, the sequence may have a predictable pattern of 1s or 0s corresponding to the frequency of the tone.

Therefore, channels designed to process white noise for use in random number generators should emphasize high bandwidth as well as the suppression of tones (regardless of tone source). Such a design is difficult to achieve in practice with semiconductor amplifiers. Many amplifiers posses 1/f noise which increases the noise voltage at low frequencies. This may be viewed as the presence of a continuous spectrum of tones, in the lower frequency portion of the channel. Furthermore, amplifiers having high enough gain bandwidth product to successfully amplify noise to a level where a decision device can make a decision yet still have enough bandwidth to introduce enough flips between sampling times are difficult to design. Also, amplifiers possess voltage offsets that bias the noise signal resulting in decision rates other than 50% 1 and 50% 0.

SUMMARY OF THE INVENTION

An apparatus is described comprising a noise source coupled to an input of a gain stage. The apparatus also includes a noise shaping stage that forms a shaped noise signal by reducing 1/f noise introduced by the gain stage. The noise shaping stage has an input coupled to an output of the gain stage. The apparatus also has a decision circuit that decides whether the shaped noise signal, or a signal derived from the shaped noise signal corresponds to a 1 or a 0.

A method is described that amplifies a first noise signal to produce a second noise signal. A shaped noise signal is formed by reducing 1/f noise introduced to the second noise signal by the amplifying. A random sequence is generated by comparing, against a reference, the shaped noise signal or a signal derived from the shaped noise signal.

BRIEF DESCRIPTION OF THE DRAWINGS

The present invention is illustrated by way of example and not limitation in the figures of the accompanying drawings, in which like references indicate similar elements, and in which:

FIG. 3b shows a method of the embodiment shown in FIG. 3a.

FIG. 4b shows one embodiment of the amplifier of FIG. 4a.

FIG. 5b shows timing signals associated with the noise shaping stage embodiment shown in FIG. 5a.

FIG. 5c shows one embodiment of a chopper switch used in the noise shaping stage embodiment shown in FIG. 5a.

DETAILED DESCRIPTION

An apparatus is described as comprising a white noise source that is coupled to a gain stage having an amplifier. The gain stage is coupled to a noise shaping stage that is also coupled to a decision circuit.

Another apparatus is described having a white noise source which is differentially coupled to a gain stage that has a cascade of open loop amplifiers. The gain stage is differentially coupled to a noise shaping stage which is also differentially coupled to a decision circuit.

A method is described that involves differentially coupling white noise into a gain stage. The white noise is differentially amplified with an amplifier that produces a first white noise signal. 1/f noise and offset voltage is substantially removed from said first white noise signal to produce a second white noise signal. A random sequence signal is produced by deciding whether the second white noise signal is a 1 or 0.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Figure 3A:
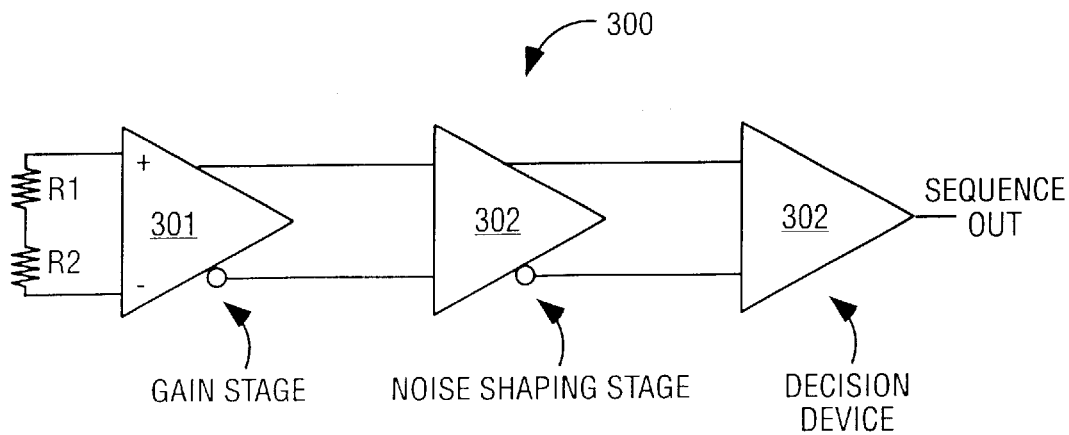
FIG. 3a shows one embodiment of a random sequence generator.
Figure 3B:
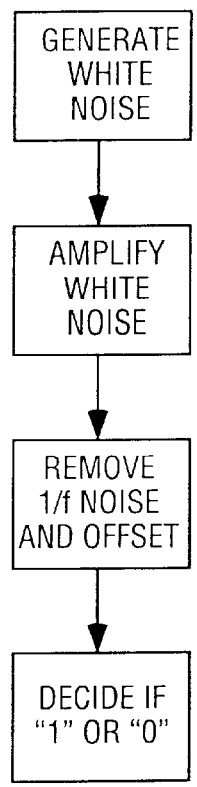

FIG. 3a shows an embodiment of a circuit 300 used for generating a random sequence of binary numbers. A corresponding embodiment of a method is shown in FIG. 3b. The gain stage 301 amplifies random noise. Noise shaping stage 302 eliminates or reduces undesirable amplifier characteristics such as 1/f noise and/or offset voltage. Decision device 303 "decides" whether the random noise value is a 1 or 0. Following is a discussion of each stage. For each stage, a specific embodiment is referred to as an example. Also, some discussion of alternate embodiments is provided.

Figure 1A:
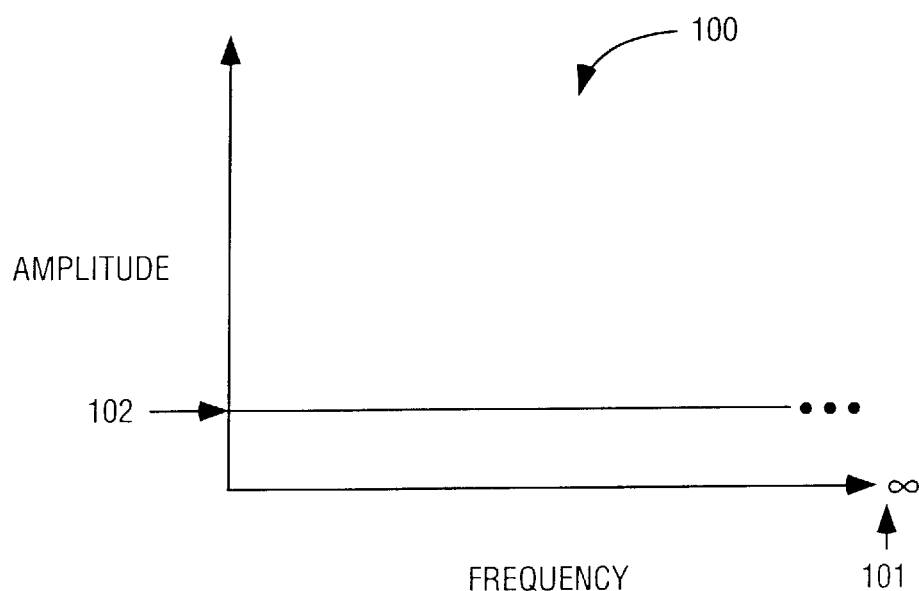
FIG. 1a shows theoretically perfect white noise.
Figure 1B:
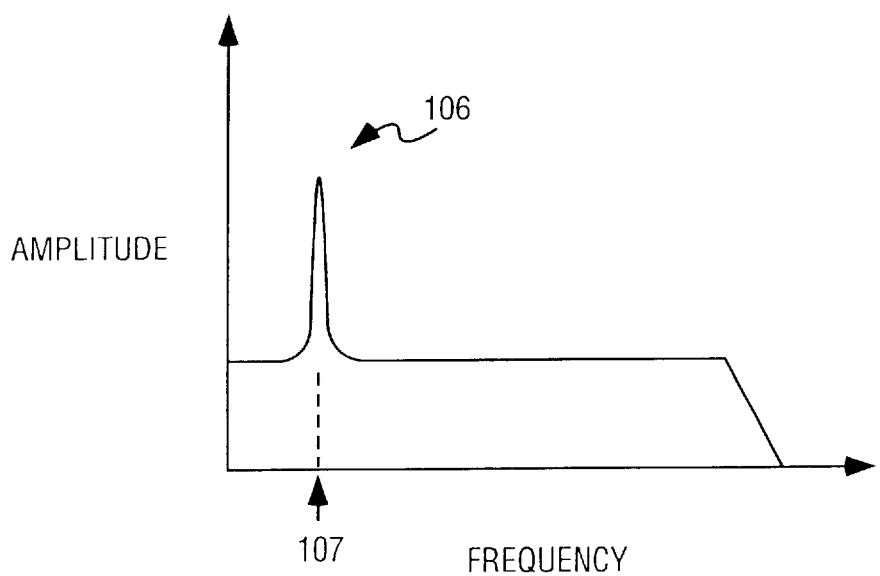
FIG. 1b shows less than theoretically perfect white noise.
Figure 2:
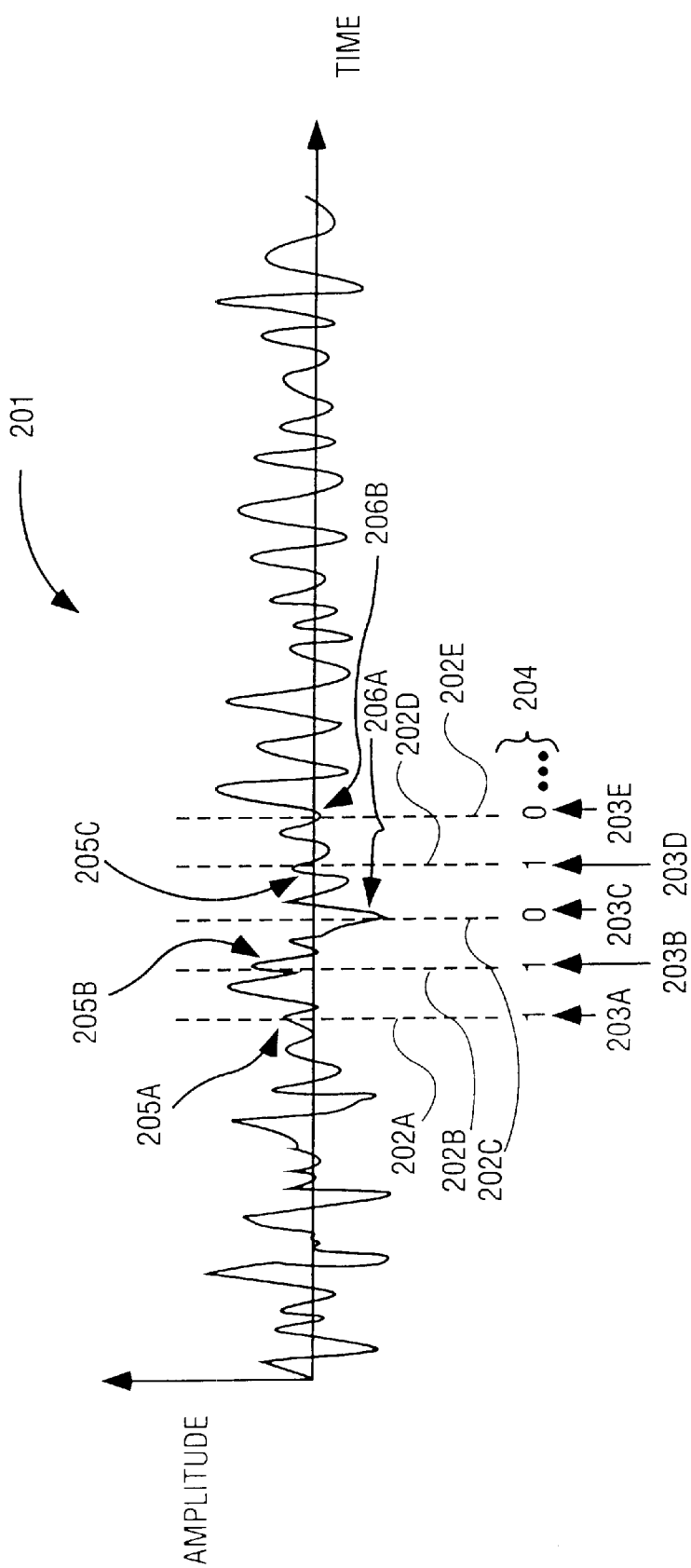
FIG. 2 shows a random sequence generated from white noise.
Figure 4A:
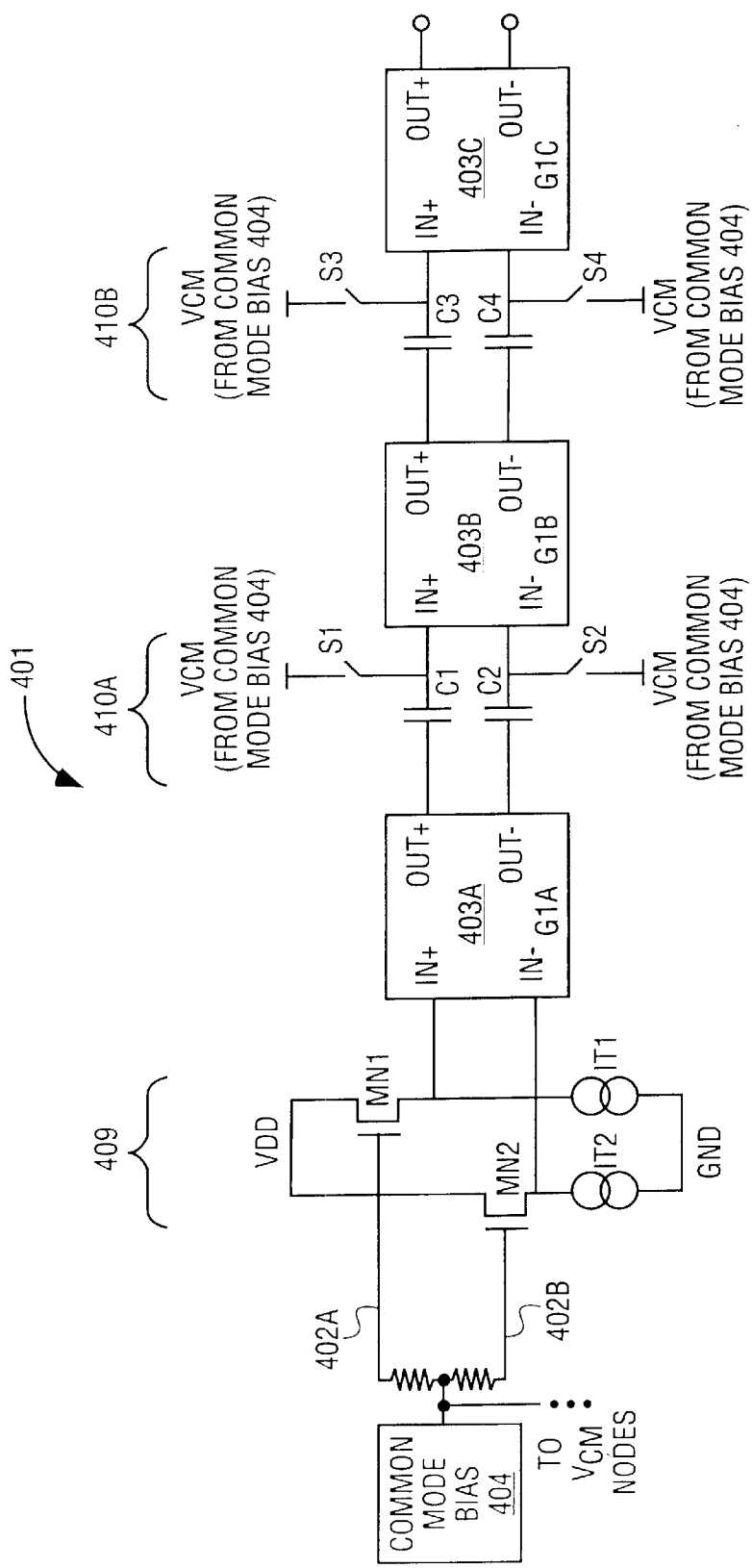
FIG. 4a shows one embodiment of the gain stage of FIG. 3.

FIG. 4a shows an embodiment 401 of the gain stage 301 of FIG. 3. The gain stage 401 amplifies random noise. In this embodiment, the gain stage 401 amplifies white noise produced by resistors R1 and R2. Resistors R1 and R2 each produce independent, random noise due to thermally induced variations in carrier concentrations through the resistors R1, R2. The general equation for the noise power amplitude (e.g., level 102 of FIG. 1a) is:

$$4kTR \qquad \text{Eqn. 1}$$

where k is Boltzman's constant, T is the temperature, and R is the resistance value. Thus resistors R1 and R2 may be viewed as two independent white noise sources. White noise sources produce signals that may be characterized similar to those shown back in FIG. 1a.

In this embodiment, a differential approach is employed. That is, two signal paths 402a,b ("+" and "−") are entertained such that the amplifiers 403a,b,c amplify the voltage difference between the two signal paths 402a,b. The signal paths start at the input of gain stage 401 (as indicated at 402a,b) and continue forward to the output of gain stage 401. A differential design inherently reduces or eliminates common voltages. For example, if an extrinsic source generates electromagnetic interference which reproduces as an unwanted voltage within gain stage 401, the unwanted voltage is likely to appear on both signal paths. That is, the unwanted voltage is common to both signal paths. Since amplifiers 403a,b,c are designed to amplify the difference between the two signal paths (i.e., subtract the voltages between the two signal paths and then amplify the result of the subtraction) the unwanted common voltage is rejected by the amplifiers 403a,b,c.

As the two white noise sources associated with resistors R1 and R2 are independent, there exists little common mode between them. That is, since two purely random signals have no commonality between them, the inherent common mode rejection of gain stage 401 has no appreciable effect on the randomness of the signal produced. The difference of two random voltage signals produces a random signal. Similarly, common mode bias circuit 404 (used to set the DC operating point of the input to each amplifier 403a,b,c) has no appreciable effect on random performance.

Alternate embodiments may employ a single ended approach (i.e., a differential approach is not employed). However, these approaches may be more susceptible to extrinsic, unwanted signal sources and as such may be limited in application (e.g., used only in clean electromagnetic environments).

Next amplifiers 403a,b,c are discussed. For typical applications, the white noise voltage from resistors R1 and R2 are in the 100 $\mu$V range while the signal used for decision making is in the 100 $\mu$V range. This corresponds to an approximate gain of 50 dB (i.e., a linear gain of approximately 316) for the gain stage 401. Other applications may design for an order of magnitude less or more for either the white noise voltage and decision making voltage ranges. For example, any gain between 40 dB and 60 dB (i.e., linear gain from 100–10000) may be useful.

Figure 4B:
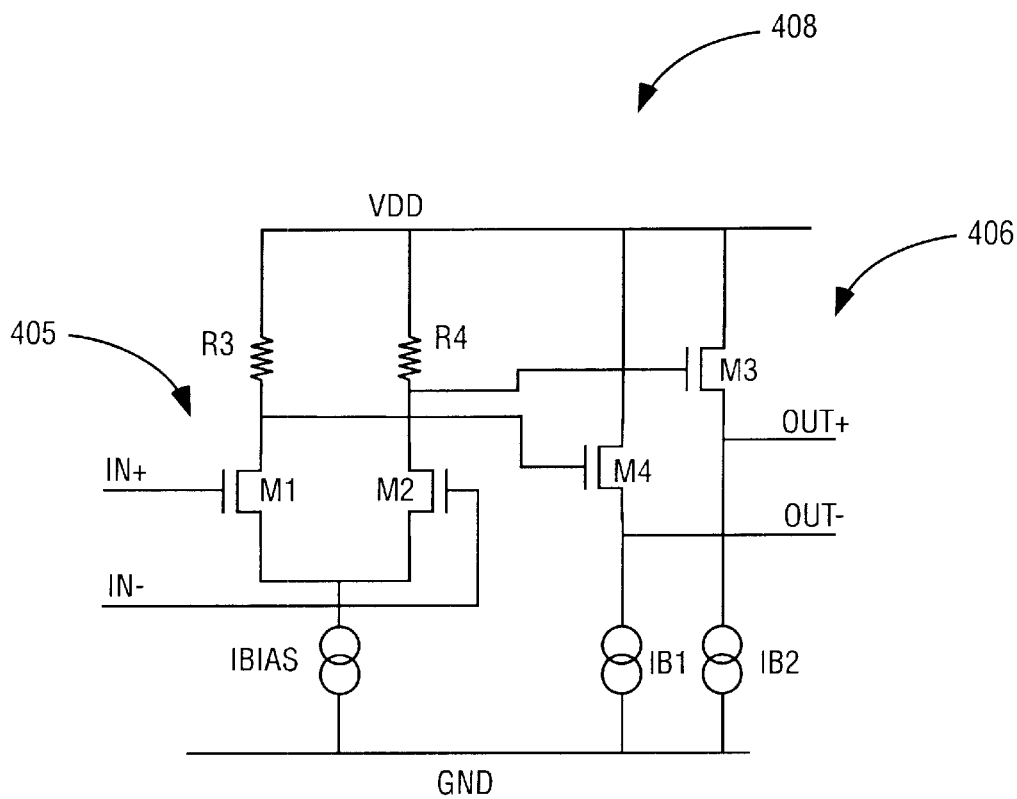

Cascades of low gain, wide band gain stages generally have greater gain-bandwidth product than closed loop operational amplifier circuits. As such, in the embodiment of FIG. 4a, three amplifiers 403a,b,c are shown. Each amplifier 403a,b,c may be designed according to the amplifier design 408 shown in FIG. 4b. The amplifier design 408 of FIG. 4b shows a differential amplifier 405 followed by a differential follower stage 406. The differential follower stage 406 allows for large small-signal output current regardless of the magnitude of the small-signal output voltage. Thus, follower stage 406 gives amplifier design 408 a low output impedance.

The magnitude of the gain of amplifier design 408 is largely determined by the magnitude of the gain of differential amplifier 405 which may be expressed as:

$$g_m R3 \qquad \text{Eqn. 2}$$

where $g_m$ is the transconductance of device M1 (which is approximately the same as the transconductance of device M2) and R3 is a load resistance of differential amplifier 405 (which is approximately the same as load resistance R4). Typical embodiments use device dimensions that correspond to device transconductances in the 100s of $\mu V/V^2$. For example, one embodiment employing 0.5 $\mu$m technology uses a device transconductance of 350 $\mu V/V^2$. In this same embodiment, in order to produce a gain of approximately 50 db, the three amplifiers 403a,b,c of FIG. 4a are each given a gain of approximately 7.0 ($7.0^3=342=50.7$ dB). This corresponds to a load resistance R3 of 20 k.

It will be apparent to those skilled in the art that various combinations of: 1) the number of amplification stages, 2) the gain of each amplification stage 403 and 3) the combination of device transconductance and load resistance R3 may be used to employ the needed gain of the gain stage of FIG. 4a. Thus the invention should not be construed to be limited to the above values. Furthermore, these concepts may be extended to other technologies besides field effect transistor technology (such as Si bipolar or GaAs MESFETS) as shown in FIG. 4b. For example, bipolar devices can almost directly replace the MOSFETS in FIG. 4B. Also, designs other than design 408 are available to those skilled in the art and may be used within the amplifiers 403a,b,c.

As discussed, the bandwidth of the signal paths should be maximized along with the gain. The bandwidth of amplifier design 408 is determined mostly by a pole occurring at:

$$1/(2\pi R3 Cl) \qquad \text{Eqn. 3}$$

where Cl is the load capacitance observed at the output of differential amplifier 405. Cl is typically a combination of: 1) the drain capacitance associated with devices M1 and M2; 2) the gate capacitance of M3 and M4 and 3) the capacitance associated with R3 and R4. For 0.5 $\mu$m technologies, Cl is in the range of a 100 fF. Thus, using, Equation 3, a pole appears at 159 MHz for the above described design 408. Again, if three amplification stages 403a,b,c are used, the channel begins to drop at 60dB/decade after 159 MHz. This also corresponds to a unity gain of approximately 1.1 Ghz. Hence, the cascade of three amplifiers 403a,b,c implemented with three amplifier designs 408 offers suitable gain (approximately 50 dB in this example while offering large bandwidth).

Various device dimensions may be employed which may produce various pole values. Nevertheless, one of ordinary skill may readily determine a suitable pole frequency for the particular application. Again, note that feedback is not used in the embodiment shown in FIG. 4. This is consistent with the perspective that a cascade of low gain (e.g., 20 dB or less), high bandwidth (e.g., 100 MHz or higher) open loop amplifiers (e.g., amplifiers 403a,b,c) may be used to implement the gain stage 301 of FIG. 3. Other embodiments may use feedback, however, large gain-bandwidth product amplifiers are recommended.

Referring back to FIG. 4a, note that gain stage 401 also shows a buffer circuit 409 and interface circuits 410a,b. The buffer circuit 409 provides a smaller capacitance load for the white noise produced by resistors R1, R2 than the input of amplifier 403a. That is, resistors R1, R2 may be viewed as passive voltage sources incapable of producing current needed to drive certain capacitive loads. Buffer circuit 409 is designed to have small input capacitance while having sufficient current drive capability to drive the input of amplifier 403a. Typically, this manifests itself by using smaller transistors in buffer circuit 409 than in the front end of amplifier 403a. The specific embodiment of FIG. 4a shows a follower design for buffer circuit 409, however, this is not necessarily required.

Interface circuits 410a,b are used to remove DC offsets in the channel while simultaneously providing the common mode bias 404 voltage. Decoupling capacitors C1–C4 remove DC offset associated with the preceding amplification stage while the precharge switches S1–S4 couple the common mode bias 404 to the following amplification stage. The switches may be closed either at the start of production of a random sequence (which permanently couples the common mode bias 404 to the amplification stage front end) or periodically open and close during the production of a random sequence with the use of a clock. This helps maintain the common mode reference voltage.

Alternatively, the interface circuits 410a,b may be removed from gain stage 401, opting instead to remove DC offsets downstream in noise shaping stage 302 (referring briefly back to FIG. 3). The interface circuits 410a,b help avoid supply rail clamping of any of the output stages of the amplifiers (e.g., amplification stage 403c) due to the amplification of the preceding offsets.

Figure 5A:
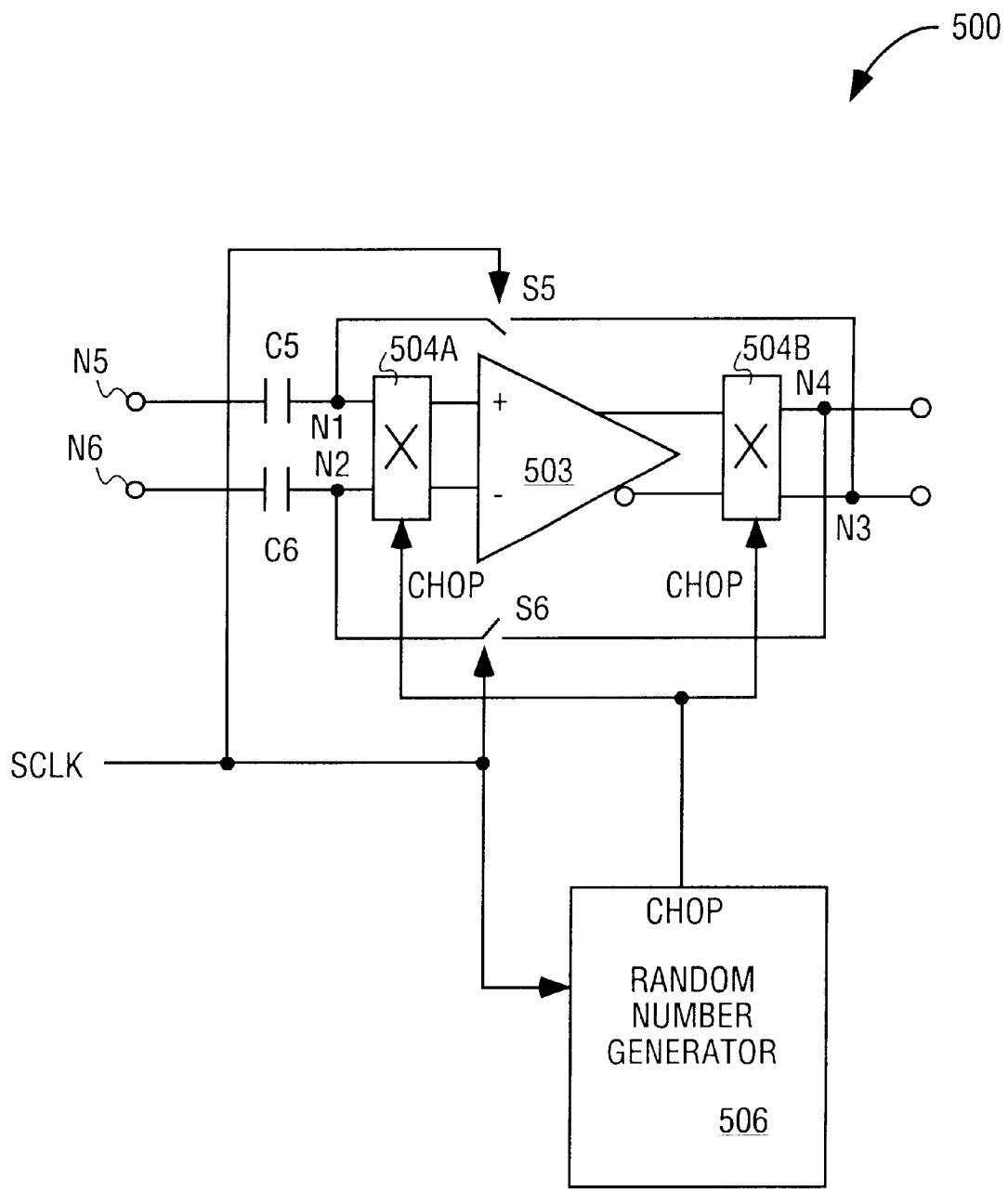
FIG. 5a shows one embodiment of the noise shaping stage of FIG. 3.

Moving on to a description of the noise shaping stage 302 of FIG. 3, FIG. 5a shows an embodiment 500 of a circuit that may be used for this function. Capacitors C5, C6 remove the DC component of the amplified white noise from gain stage 301 (referring briefly back to FIG. 3). However, as discussed in the background, amplifier circuits typically contain 1/f noise. Since the 1/f noise may be viewed as a continuous collection of unwanted tones in the lower end of the passband spectrum, they pass through the capacitors C5, C6. As such, to preserve the white noise portion of the signal, the 1/f noise should be removed.

Thus, in the embodiment of FIG. 5a, noise shaping stage 302 employs a filtering technique to remove the 1/f noise. In this embodiment of the noise shaping stage, a Correlated Double Sampling Technique is used. Correlated Double Sampling (CDS) subtracts a past signal (i.e., a signal that occurred at some point in the past, also referred to as an instantaneous signal) with a present signal (i.e., a signal that is occurring presently). The subtractions are typically made periodically; that is, each subtraction is made at fixed intervals after previous subtractions.

Figure 5B:
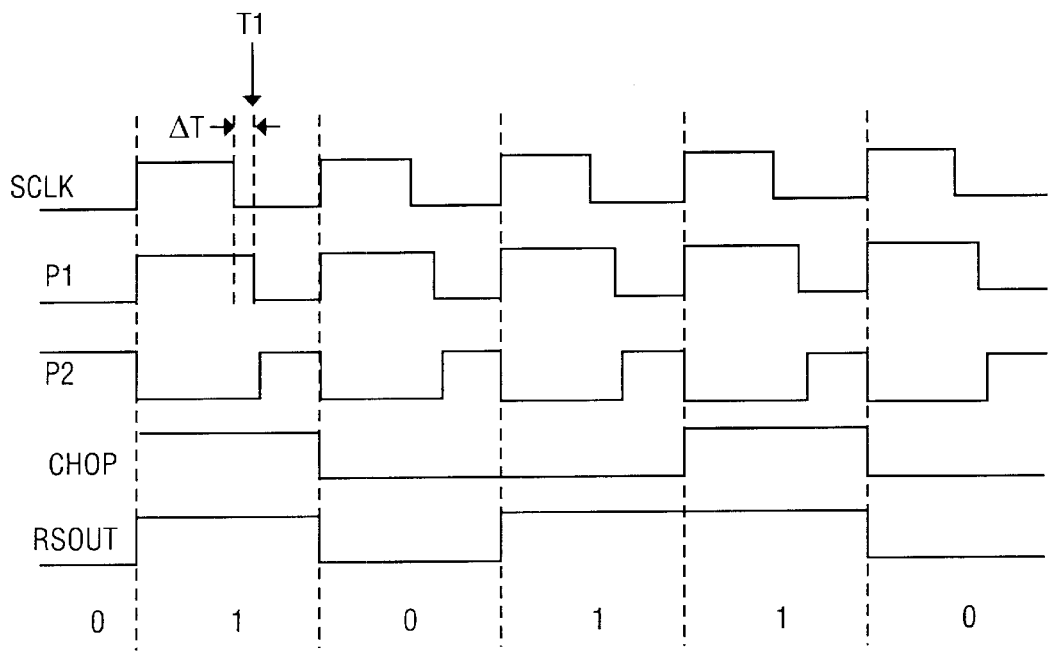

FIG. 5b, shows the timing associated with the CDS technique of the embodiment of FIG. 5a. In this embodiment as discussed ahead, the periodic subtraction itself is made in the decision device 303 (referring briefly back to FIG. 3). The noise shaping stage 302 sets up the signal so the subtraction can be made. That is, in this embodiment, the noise shaping stage 302 continuously presents the decision device 303 with the subtraction of the present noise signal and a past signal; however, the subtraction is only accounted for in periodic increments due to the periodic operation of the decision device 303.

The past signal is formed by: 1) the activity of switches S5, S6 coupled with 2) the effects of this activity on the voltage across capacitors C5, C6 and 3) the amplification stage 503 which has a unity gain in this embodiment. Referring to the embodiment of FIG. 5a in conjunction with FIG. 5b, during the high time of the serial clock Sclk, switches S5, S6 are closed. The input nodes N1, N2 to amplification stage 503 are respectively driven to the output voltages associated with nodes N3, N4 of amplification stage 503. Thus, each output of amplification stage 503 charges one plate of C5 or C6. That is, the voltage at node N3 charges a plate on C5 while the voltage at node N4 charges a plate on C6. Meanwhile, the output voltages of gain stage 301 (appearing at nodes N5, N6) are respectively charging the opposite plates of C5 and C6. That is, the voltage at node N5 charges a plate on C5 and the voltage at node N6 charges a plate on C6.

At the falling edge of Sclk, switches S5 and S6 are opened. Since the charge in the capacitor is constant, the difference between the voltages at nodes N5 and N3 at the instant Sclk falls is stored on capacitor C5 (refer to this voltage as Np0). Similarly, the difference between the voltages at nodes N6 and N4 at the instant Sclk falls is stored on capacitor C6 (refer to this voltage as Nm0). Thus voltages Np0 and Nm0 represent the instantaneous voltages across capacitors C5, C6 when Sclk falls. These voltages are the starting points for a sample period and are now referred to as past voltages.

Furthermore, since the current through a capacitor can change abruptly, capacitors C5, C6 act as short circuits for the time varying white noise emerging from gain stage 301 (i.e., nodes N5, N6). Thus, after a time $\Delta T$ (i.e., time T1 as shown in FIG. 5b), the voltages of nodes N5, N6 at time T1 also respectively appear on nodes N1, N2 at time T1. Refer to these voltages as Np and Nm, respectively. Since they represent voltages presently at the gain stage 301 output, they are referred to as present voltages.

The differential output voltage of amplification stage 503 (i.e., the difference between voltages at nodes N3 and N4) is given by:

$$Vout=((Np-Np0)-(Nm-Nm0))=((Np-Nm)-(Np0-Nm0)) \quad \text{Eqn. 4}$$

Substituting Nt for Np−Nm (the differential present voltage) and N0 for Np0−Nm0 (the differential past voltage), Eqn. 4 may be rewritten as $$Vout=(Nt-N0) \quad \text{Eqn. 5}$$

Thus noise shaping stage 500 presents the decision device 303 (referring briefly back to FIG. 3) with the difference between the differential present and differential past voltages. This technique, referred to as Correlated Double Sampling (CDS), eliminates low frequencies. Thus any circuit that takes the difference between a present signal and a past signal may be referred to as a correlated double sampling circuit. Many different CDS embodiments are available or may be designed by those skilled in the art.

The CDS circuit of FIG. 5 operates as follows: within time $\Delta T$ low frequency signals hardly change amplitude and are therefore subtracted to zero by the operation represented by Equation 5. Meanwhile, high frequency signals may change significantly within time $\Delta T$ resulting in significant voltage magnitude from the operation represented by Equation 5.

In the embodiment associated with FIGS. 5a and 5b, the decision is made at the falling edge of P1. One such embodiment has values of 100 Khz for Sclk and 1 $\mu$s for $\Delta T$. This corresponds to subtracting the past and present voltages according to nT−T/10 where T is 10 $\mu$s (which corresponds to 1/Sclk) and n is an integer. That is, the present voltage occurs every nT with the past voltage occurring T/10 before every present voltage. The transfer function of this activity eliminates low frequencies which in turn helps diminish 1/f noise.

Figure 5C:
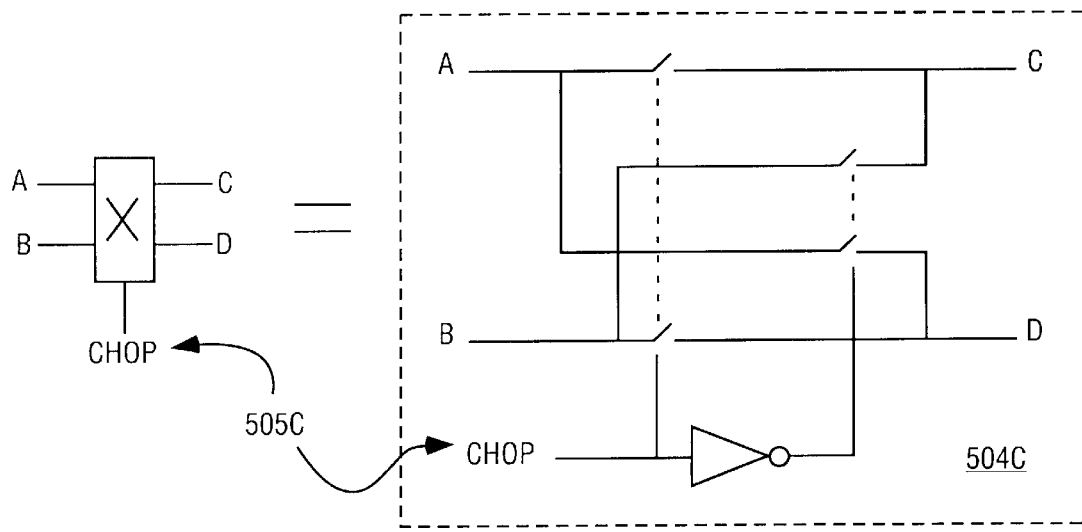

Another feature of the amplification stage 503 embodiment shown in FIG. 5a is the removal of offset voltage associated with amplification stage 503 by chopper switches 504a,b. Offsets bias the randomness of downstream decision making. For example, a positive offset voltage will result in more "1s" than "0s" over a period of time. A more detailed depiction 504c of each of the chopper switches 504a,b is shown in FIG. 5c. When the chop signal 505c is high, node "a" is coupled to node "c" and node "b" is coupled to node "d". When the chop signal 505c is low, node "a" is coupled to node "d" and node "b" is coupled to node "c". Note the chopper switches 504a,b for the "d" embodiment of FIG. 5a,c are differential in nature.

Referring back to FIG. 5a, in this embodiment, amplification stage 503 has a unity gain. Thus its offset voltage appears as a difference between the voltages at nodes N3 and N4. The chopper switches 504a,b alternate the feedback of the output nodes. Specifically, output node N3 is alternatively feedback into the "+" and "−" input nodes of amplification stage 503. Similarly, output node N4 is alternatively feedback into the "+" and "−" input nodes of amplification stage 503. Any offset voltage is therefore continually reversed which results in an average offset of zero offset over an extended period of time. The chop signal is therefore a signal that controls the timing associated with alternating the feedback between input nodes of an amplifier from an output node of an amplifier. Furthermore, as many different chopper approaches may be used by those skilled in the art, the invention extends to chopper circuits generally. Chopper circuits are any circuits that alternate feedback between input nodes of an amplifier from an output node of an amplifier. Other embodiments may use a non-unity gain approach.

The chop signal may be periodic. However, unwanted tones (typically at the chop signal frequency or harmonics thereof) have been observed for such embodiments. Thus, embodiments where the chop signal changes state (i.e., low to high or high to low) pseudo-randomly or randomly improves the randomness of the numeric sequence.

As such, FIG. 5a shows chopper switches 504a,b driven by a pseudo random or random number generator 506. These approaches essentially spread the tone power from a fixed frequency (for periodic chopping) across a wider bandwidth. For pseudo random approaches, the fixed tone frequency (associated with fixed frequency chopping) is converted into smaller tones spread periodically across the frequency spectrum.

For truly (or near truly) random chopping interval approaches, the fixed tone frequency is evenly spread in a continuum across frequency space. By converting the amplitude of a large tone (for periodic chopping) into many smaller tones (for pseudo random chopping) or white noise (for random chopping) the channel looks more like white noise and the randomness of the numeric sequence is improved.

A pseudo random approach is any approach that produces a repetitive bit stream having a module of $2^n-1$ (where n is an integer) to produce the chop signal, while a truly (or near truly) random approach uses white noise or nearly white noise (usually instead of a clock such as Sclk) to generate the chop signal. For example, a random sequence generator such as that shown in FIG. 3 may be used for random number generator 506.

The following discussion concerns the decision device 303 of FIG. 3. A decision device 303 is any device that decides whether or not an analog input signal is a logic high (i.e., a "1") or a logic low (i.e., a "0"). As discussed with reference to the CDS techniques and FIGS. 5a,b a decision is made according to Equation 5 at T1 of FIG. 5b. That is, the decision is made at the rising and falling edges of P2 and P1, respectively.

Figure 6:
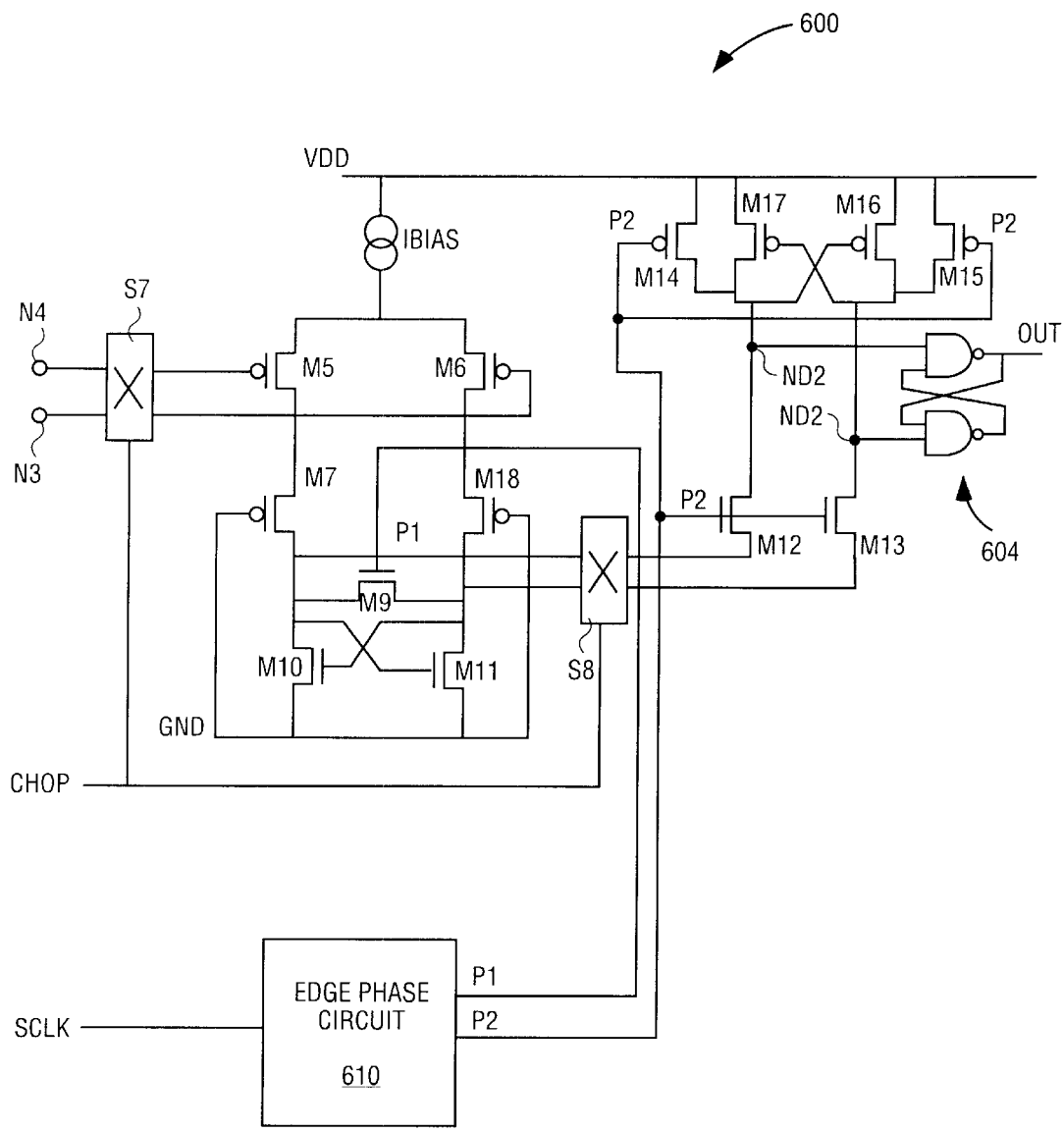
FIG. 6 shows one embodiment of the decision circuit of FIG. 3.

FIG. 6 shows an embodiment 600 of the decision device 303 of FIG. 3 which effectively operates as a zero crossing detector. That is, when the voltage difference between nodes N4 and N3 is positive (and the chopper switches are connected as "straight through") the decision circuit 600 produces a logic high. Similarly when the voltage difference between nodes N4 and N3 is negative the decision circuit 600 produces a logic low.

Edge phase circuit 610 of FIG. 6 is responsible for delaying the falling edge of Sclk by the amount $\Delta T$ in order to produce signal P1 (as shown in FIG. 5b). Similarly, the edge phase circuit 610 is responsible for creating P2, an inverted form of P1. The decision device 600 uses P1 and P2 to trigger its decision as described below.

When chop switches S7, S8 are "straight through": 1) N4 is coupled to M5; 2) N3 is coupled to M6; 3) M7 is coupled to M12; and 4) M8 is coupled to M13. When P1 is high, M9 is on and devices M12, M13 are off. M5 and M6 operate as a differential pair responding to the voltage difference between N4 and N3. Regenerative devices M7, M8 are coupled together since M9 is on. This has the effect of limiting the gain of the differential amplification by M5 and M6 as observed at M12 and M13. However, once P1 goes low, M9 is off and the gain observed by M12 and M13 (which are now on) exponentially grows.

Since P2 is then high, M14 and M15 are now on. Devices, M14–M17 form a latch that drives node pair ND1, ND2 to [ground, Vdd] or [Vdd, ground] respectively depending on the amplified difference value at M12, M13. In this embodiment, Nodes ND1 and ND2 are further latched by latch 604 which provides the final output signal. As many other decision circuit embodiments are available within the art or may be readily designed by those within the art, the invention should not be construed as limited to the embodiment 600 of FIG. 6.

What is claimed is:

1. An apparatus, comprising:
   a) a noise source coupled to an input of a gain stage;
   b) a noise shaping stage that forms a shaped noise signal by reducing 1/f noise introduced by said gain stage, said noise shaping stage having an input coupled to an output of said gain stage; and
   c) a decision circuit that decides whether said shaped noise signal corresponds to a 1 or a 0.

2. The apparatus of claim 1 wherein said gain stage is a differential gain stage.

3. The apparatus of claim 1 wherein said noise shaping stage also forms said shaped noise signal by reducing an offset voltage introduced by said gain stage.

4. The apparatus of claim 1 wherein said noise source further comprises a white noise source.

5. The apparatus of claim 4 wherein said white noise source further comprises a resistor.

6. The apparatus of claim 1 wherein said gain stage further comprises an open loop amplifier.

7. A method, comprising:
   a) amplifying a first noise signal to produce a second noise signal;
   b) forming a shaped noise signal by reducing 1/f noise introduced to said second noise signal by said amplifying; and
   c) comparing a said shaped noise signal against a reference to generate a random sequence.

8. The method of claim 7 wherein said 1/f noise is reduced by a correlated double sampling technique.

9. The method of claim 7 wherein said amplifying further comprises differentially amplifying.

10. The method of claim 9 wherein said first noise signal corresponds to the difference between noise generated from a first noise source and noise generated from a second noise source.

11. The method of claim 10 wherein said first noise signal is a white noise signal.

12. The method of claim 7 wherein said amplifying a first noise signal further comprises amplifying a first noise signal without feedback.

13. The method of claim 7 wherein said forming a shaped noise signal further comprises reducing an offset voltage introduced to said second noise signal by said gain stage.

14. An apparatus, comprising:
   a) a first means for amplifying a noise signal, said amplifying introducing 1/f noise to said noise signal;
   b) a second means for reducing said 1/f noise so as to produce a shaped noise signal; and
   c) a third means for deciding whether said shaped noise signal corresponds to a 1 or a 0.

15. The apparatus of claim 14 further comprising a fourth means for providing said noise signal to said first means.

16. The apparatus of claim 14 wherein said first means further comprises a means for amplifying said noise signal without feedback.

17. The apparatus of claim 14 wherein said first means further comprises a means for providing a differentially amplified noise signal.

18. The apparatus of claim 14 wherein said second means further comprises a means for correlated double sampling of said noise signal with said 1/f noise.

19. The apparatus of claim 14 wherein said second means further comprises means for removing an offset voltage introduced to said noise signal by said amplifying.

* * * * *

UNITED STATES PATENT AND TRADEMARK OFFICE
CERTIFICATE OF CORRECTION

PATENT NO. : 6,414,558 B1
DATED : July 2, 2002
INVENTOR(S) : Ryan et al.

It is certified that error appears in the above-identified patent and that said Letters Patent is hereby corrected as shown below:

<u>Title page,</u>
Item [75], Inventors, delete "(IL)" and insert -- (IE) --.
Item [73], Assignee, delete "(IR)" and insert -- (IE) --.

Signed and Sealed this

Fourth Day of February, 2003

JAMES E. ROGAN
*Director of the United States Patent and Trademark Office*